(12) United States Patent
Fujihira et al.

(10) Patent No.: US 6,868,786 B2
(45) Date of Patent: Mar. 22, 2005

(54) PATTERNING METHOD WITH MICRO-CONTACT PRINTING AND ITS PRINTED PRODUCT

(75) Inventors: Masamichi Fujihira, Kawasaki (JP); Uichi Akiba, Hadano (JP); Hiroki Okui, Nishinomiya (JP); Shintaro Fujii, Yamato (JP); Masaaki Kurihara, Tokyo (JP)

(73) Assignee: Dainippon Printing Co., Ltd., Tokyo (JP)

(*) Notice: Subject to any disclaimer, the term of this patent is extended or adjusted under 35 U.S.C. 154(b) by 0 days.

(21) Appl. No.: 10/738,367

(22) Filed: Dec. 12, 2003

(65) Prior Publication Data

US 2004/0134883 A1 Jul. 15, 2004

Related U.S. Application Data

(62) Division of application No. 10/108,192, filed on Mar. 27, 2002.

(30) Foreign Application Priority Data

Mar. 28, 2001 (JP) .......................... 2001-093175
Apr. 16, 2001 (JP) .......................... 2001-116468

(51) Int. Cl.[7] ................................................ B41F 1/18
(52) U.S. Cl. ................... 101/450.1; 101/483; 101/491; 101/451; 428/447; 106/287.16; 427/515
(58) Field of Search ........................ 101/450.1, 451, 101/483, 491, 401.1; 428/447; 106/287.16; 427/515

(56) References Cited

U.S. PATENT DOCUMENTS 5,958,121 A * 9/1999 Lin .......................... 106/31.43
6,471,761 B2 * 10/2002 Fan et al. ............... 106/287.16
6,635,311 B1 * 10/2003 Mirkin et al. ............ 101/450.1
2002/0098364 A1 * 7/2002 Bernard et al. ............ 428/447
2002/0122873 A1 * 9/2002 Mirkin et al. .............. 427/2.1
2004/0037959 A1 * 2/2004 Mirkin et al. ............... 427/256

OTHER PUBLICATIONS

Phase Separation of Ultrathin Polymer Blend Films on Patterned Surfaces A. Karim, Physical Review E, vol. 57, No. 6, Jun. 1998.*

* cited by examiner

*Primary Examiner*—Eugene H. Eickholt
(74) *Attorney, Agent, or Firm*—Flynn, Thiel, Boutell & Tanis, P.C.

(57) ABSTRACT

A patterning method for micro-contact printing involves the steps of: applying a resin on a master having projected patterns, hardening the resin and thereafter removing the hardened resin from the master to make a stamp of the resin; applying a molecular ink including hydrophobic molecules dispersed in a solvent on the stamp; forming micro-contact printed patterns of the hydrophobic molecular layer on a substrate by means of the stamp on which the molecular ink is applied; dipping the substrate with micro-contact printed patterns in a hydrophilic molecule solution dispersed in a solvent to give chemical modification to the areas of the surface of the substrate around the micro-contact printed patterns, the solution including hydrophilic molecules having a chain length shorter than the chain length of hydrophobic molecules included in the molecular ink is used as the hydrophilic molecule solution. According to the method, printed products having micro-contact printed patterns of a molecular level are obtained with a contrast between the micro-contact printed patterns and the area of the surface of the substrate around the micro-contact printed patterns.

8 Claims, 11 Drawing Sheets

—CH$_3$(CH$_2$)$_{11}$SH

—COOH(CH$_2$)$_{15}$SH

PATTERNING METHOD WITH MICRO-CONTACT PRINTING AND ITS PRINTED PRODUCT

This is a division of Ser. No. 10/108,192, filed Mar. 27, 2002.

BACKGROUND OF THE INVENTION (1) Field of the Invention

The present invention relates to a patterning method for micro-contact printing which makes it possible to form micro-contact printed patterns with a size as large as a molecule used in the production of a variety of functional molecular devices and a DNA chip and printed product obtained by this method.

(2) Description of the Prior Art

In the field of molecular chemistry, L. Carter proposed the concept of a molecular device in 1982. Research and development in this field has been actively carried out in enterprise, university and research institutes since that time. For example, if a specific function is given to each organic molecule, respectively and an assembly of these organic molecules is formed, the assembly of organic molecules makes possible the formation of a semiconductor device with a super-high integrated density such that there is no comparison between the integrated density of a semiconductor device formed of the assembly of organic molecules and that of a conventional semiconductor device. Further, in recent years, the genome analysis of DNA has been actively studied and the so-called biochip has attracted the attention of people. The application thereof is also thought for the development of the biochip.

On the other hand, in photolithography employed until now as a method of reproducing micro-contact printed patterns, there is a limit for the reproduction of micro-contact printed patterns in respect of mass-production of micro-contact printed patterns being made in a short time since a substrate with desired micro-contact printed patterns should be reproduced through several steps. Further, photolithography is not suited for materials with a low heat resistance and low mechanical resistance such as cells, DNA and enzymes, since photolithography is carried out through complicated steps such as exposure, development and etching. Further, printing method makes possible the production of massive printed products. However, the reproduction of micro-contact printed patterns of the order of hundreds μm is the limit until now. Accordingly, a printing method is not suited for the reproduction of micro-contact printed patterns.

Inventors of the present invention previously invented a method of reproducing micro-contact printed patterns comprising the steps of: forming patterns of molecules with a polarity on a substrate using molecular ink including molecules with a fixed polarity dispersed in a solvent to form a first transfer layer and forming patterns of molecules with the same polarity as the above-mentioned polarity or a different polarity from the above-mentioned polarity on the substrate using molecular ink including molecules with the same polarity as the above-mentioned polarity or the different polarity from the above-mentioned polarity (Japanese patent application No. 2000-151157).

However, in the above-mentioned method, the density of the ink used is lowered for increasing the resolving power. The film of the first transfer layer has defects since the first transfer layer is transferred using an ink with a thin density. When the second transfer layer is formed, the ink for the second transfer layer comes in and contaminates the first transfer layer formed previously because an area of the first transfer layer is not covered completely with ink for the first transfer layer, so that the contrast between the first transfer layer and the second transfer layer is lowered.

Further, there is a problem that if the density of the ink for the first transfer layer is increased in order to remove defects of the first transfer layer in forming the first transfer layer, the running and spreading of ink occurs so that the resolving power is lowered.

BRIEF SUMMARY OF THE INVENTION

It is an object of the present invention to provide a patterning method for micro-contact printing which makes it possible to form briefly micro-contact printed patterns of a molecular level with a contrast between a printed area and an unprinted area around the printed area, and its printed product.

The present invention, which solves the problem concerning a patterning method for micro-contact printing, is characterized by a patterning method for micro-contact printing comprising the steps of: applying a resin on a master having projected patterns, hardening the resin; removing the hardened resin from the master to make a stamp of the resin; applying a molecular ink including hydrophobic molecules dispersed in a solvent on the stamp; forming micro-contact printed patterns of a hydrophobic molecular layer on a substrate by means of the stamp on which the molecular ink is applied; and dipping the substrate with micro-contact printed patterns in a hydrophilic molecule solution dispersed in a solvent to give chemical modification to the areas of the surface of the substrate around the micro-contact printed patterns, wherein a solution including hydrophilic molecules having a chain length shorter than the chain length of the hydrophobic molecules included in the molecular ink is used as the hydrophilic molecule solution.

According to the present invention, micro-contact printed patterns formed of a hydrophobic molecular layer are formed on a substrate using a hydrophobic molecular ink including hydrophobic molecules dispersed in a solvent and the so-called micro-contact printed patterns are formed of hydrophobic molecules having a chain length longer than the chain length of the hydrophilic molecules. Accordingly, in case that hydrophobic molecular layer has defects, when dipping an area of the substrate uncovered with the hydrophobic molecular layer, namely, an unprinted area into a hydrophilic solution, the hydrophilic solution comes in the defects. However, even in this case, since the hydrophilic molecules coming in the defects are covered with the hydrophobic molecules having a chain length longer than that of the hydrophilic molecules, the high contrast between micro-contact printed patterns and unprinted area of hydrophilic molecules can be obtained without the hydrophobic property of the micro-contact printed patterns being damaged.

An embodiment of the present invention, which solves the problem concerning a printed product, is characterized by a printed product provided with micro-contact printed patterns of a hydrophobic molecule layer formed on a substrate using a molecular ink including hydrophobic molecules dispersed in a solvent and with a hydrophilic molecule layer formed on areas of the surface of the substrate around the micro-contact printed patterns, wherein the chain length of hydrophilic molecules is shorter than the chain length of hydrophobic molecules.

Another embodiment of the present invention, which solves the problem concerning a patterning method for micro-contact printing, is characterized by a patterning method for micro-contact printing comprising the steps of: applying a resin on a master having projected patterns, hardening the resin and thereafter removing the hardened resin from the master to make a stamp of the resin; applying a molecular ink including hydrophilic molecules dispersed in a solvent on the stamp; forming micro-contact printed patterns of hydrophilic molecular layer on a substrate by means of the stamp on which the molecular ink is applied; and dipping the substrate with micro-contact printed patterns in a hydrophobic molecule solution including hydrophobic molecules dispersed in a solvent to give chemical modification to areas of the surface of the substrate around the micro-contact printed patterns, wherein a solution including hydrophobic molecules having a chain length shorter than the chain length of hydrophilic molecules included in the molecular ink is used as the hydrophobic molecule solution.

According to the inventive patterning method for micro-contact printing, a hydrophobic molecular layer is formed on an area of a substrate around micro-contact printed patterns of a hydrophilic molecular layer formed on a substrate using hydrophilic molecular ink including hydrophilic molecules dispersed in a solvent. Accordingly, in case the hydrophobic molecular layer has defects, when dipping an area of the substrate uncovered with the hydrophilic molecular layer, namely an unprinted area into hydrophobic solution, the hydrophobic solution comes in the defects. However, even in this case, since the hydrophobic molecules coming in the defects are covered with the hydrophilic molecules having a chain length longer than that of the hydrophobic molecules, the high contrast between micro-contact printed patterns and unprinted area of hydrophobic molecules can be obtained without the hydrophilic property of micro-contact printed patterns being damaged.

The present invention, which solves the problem concerning a printed product, is characterized by a printed product with micro-contact printed patterns of a hydrophilic molecule layer formed on a substrate using a molecular ink including hydrophilic molecules dispersed in a solvent and with a hydrophobic molecule layer formed on areas of the surface of the substrate around the micro-contact printed patterns, wherein the chain length of hydrophobic molecules is shorter than the chain length of hydrophilic molecules.

The present invention is also characterized by a patterning method for micro-contact printing comprising the steps of: applying a resin on a master having projected patterns, hardening the resin and thereafter removing the hardened resin from the master to make a stamp of the resin; applying a molecular ink including hydrophobic molecules dispersed in a solvent on the stamp; forming micro-patterns of a hydrophobic molecular layer on a substrate by means of the stamp on which the molecular ink is applied; and dipping the substrate with micro-contact printed patterns in a hydrophilic molecule solution including hydrophilic molecules dispersed in a solvent to give chemical modification to areas of the surface of the substrate around the micro-contact printed patterns, wherein after forming the micro-contact printed patterns, chemical modification is given to the areas of the surface of the substrate around the micro-contact printed patterns by the hydrophilic molecular ink in the water.

According to the inventive patterning method for micro-contact printing, after forming the micro-contact printed patterns of a hydrophobic molecular layer on a substrate using a molecular ink including hydrophobic molecules dispersed in a solvent, chemical modification is given to the areas of the surface of the substrate around the micro-contact printed patterns by the hydrophilic molecular ink in the water under such a state that the hydrophobic molecules are bonded with each other with hydrophobic bonds in the water, so that the probability that hydrophilic molecules come in the hydrophobic molecular layer is low. Accordingly, the high contrast between micro-contact printed patterns and an area of the substrate around the micro-contact printed patterns to which the chemical modification is given with the hydrophilic molecular ink can be obtained without the hydrophobic property of the micro-contact printed patterns being damaged.

The present invention, which solves the problem concerning a patterning method for micro-contact printing, is characterized by a patterning method for micro-contact printing comprising the steps of: applying a resin on a master having projected patterns, hardening the resin; removing the hardened resin from the master to make a stamp of the resin; applying a molecular ink including hydrophilic molecules dispersed in a solvent on the stamp; forming micro-contact printed patterns formed of a hydrophilic molecular layer on a substrate by means of the stamp on which the hydrophilic molecular ink is applied; and dipping the substrate with micro-contact printed patterns in a hydrophilic molecule solution including hydrophilic molecules dispersed in a solvent to give chemical modification to areas of the surface of the substrate around the micro-contact printed patterns, wherein after forming the micro-contact printed patterns, chemical modification is given to the areas of the surface of the substrate around the micro-contact printed patterns by the hydrophobic molecular ink in an organic solution.

According to the inventive patterning method for micro-contact printing, after forming the micro-contact printed patterns of a hydrophilic molecular layer on a substrate using a molecular ink including hydrophilic molecules dispersed in a solvent, a hydrophobic molecular ink is applied on the areas of the surface of the substrate around the micro-contact printed patterns in an organic solution, so that the probability that hydrophilic molecules come in the hydrophobic molecular layer is low. Accordingly, the high contrast between micro-contact printed patterns and an area of the substrate around the micro-contact printed patterns can be obtained without the hydrophobic property of micro-contact printed patterns being damaged.

An embodiment of the present invention, which solves the problem concerning a printed product, is characterized by a printed product provided with micro-contact printed patterns of a hydrophobic molecular layer formed on a substrate using a hydrophobic molecular ink including hydrophobic molecules and a hydrophilic molecular layer formed on areas of the surface of the substrate around the micro-contact printed patterns, wherein the printed product is produced utilizing the properties of the hydrophobic molecules of the micro-contact printed patterns being cohesive by cohesive connection in the water.

An embodiment of the present invention, which solves the problem concerning a printed product, is characterized by a printed product provided with micro-contact printed patterns of a hydrophilic molecular layer formed on a substrate using a hydrophilic molecular ink including hydrophilic molecules and a hydrophilic molecular layer formed on areas of the surface of substrate around the micro-contact printed patterns, wherein the printed product is produced utilizing the properties of hydrophilic molecules of the micro-contact printed patterns being cohesive by hydrogen connection in the organic solution.

DETAILED DESCRIPTION

Figure 1A:
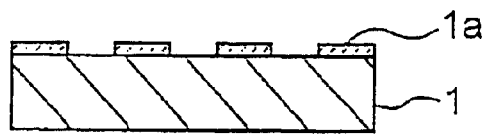
FIGS. 1(a) through (f) is a schedule drawing showing the steps for forming micro-contact printed patterns having a first transfer layer and a second transfer layer on a substrate.
Figure 1B:
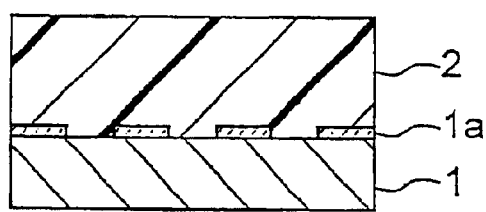
Figure 1C:
Figure 1D:
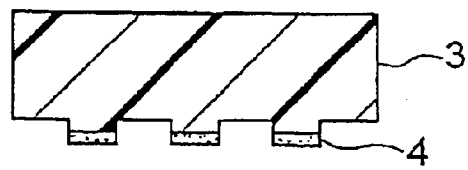
Figure 1E:
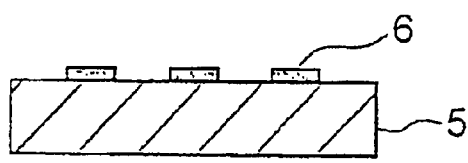
Figure 1F:
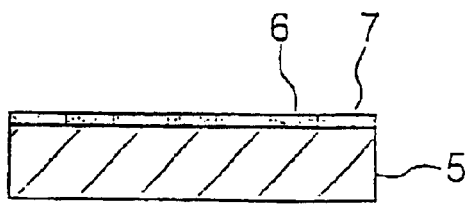

Then, a mode of the present invention is explained referring to the drawings.

Referring to FIGS. 1(*a*) through (*f*), the steps of a first patterning method with micro-contact printing according to the present invention is explained.

First, as shown in FIG. 1(*a*), a master having projected patterns 1 with a desired height is formed. As materials of master 1, silicon or quartz is used or a laminate of a layer of silicon or quartz with a layer of a metal or metal oxide. The projected pattern is a resist pattern 1*a* formed on the materials by photolithography or ionizing radiation lithography such as electron beam lithography or AFM lithography. The height of the projected pattern 1*a* is desirably about 1 through 5 μm.

Then, as shown in FIG. 1(*b*), a resin 2 is applied on the surface of master 1 with the projected pattern, hardened and thereafter as shown in FIG. 1(*c*), the resin 2 is removed from the master 1, so that a stamp 3 of the resin is formed. The resin of stamp 3 is preferably polydimethylsiloxane (PDMS). The polydimethylsiloxane is cast and hardened to form stamp 3.

Then, as shown in FIG. 1(*d*), a molecular ink 4 having hydrophobic molecules disposed in a solvent is applied on the stamp 3. Micro-contact printed patterns 6 of hydrophobic molecules are formed on a substrate 5 having a coating layer of gold, silver or copper on the surface of a material such as glass plate by means of stamp 3.

As the molecular ink 4 having hydrophobic molecules dispersed in a solvent used can be an ink including any of molecules having an SH group at the terminal end thereof, silane coupler, or carboxylic acid, sulfonic acid, phosphonic acid, phosphoric acid or acid chloride thereof dispersed in an organic solvent such as ethanol, toluene or methylene chloride or an ethanol solution of an alkanethiol $CH_3(CH_2)_xSH$ or an ink including molecules having the molecular formula represented by X (any of the under-mentioned structural formula (1) through (7)) —$(CH_2)_n$— (part expressed by any of the under-mentioned structural formula (1) through (7)) —$(CH_2)_m$—Y in which m and n≧0 and X is positioned at one end of the molecular formula and is a hydrophobic group and Y is positioned at the other end of the molecular formula and is a group such as —SH, —COOH, —$SO_3$ H, —$PO_3$H, $PO_3$ $H_2$, —COCl, —$SO_2$ Cl, —$PO_3$Cl or —$PO_2Cl_2$ dispersed in an organic solvent such as ethanol, toluene and methylene chloride.

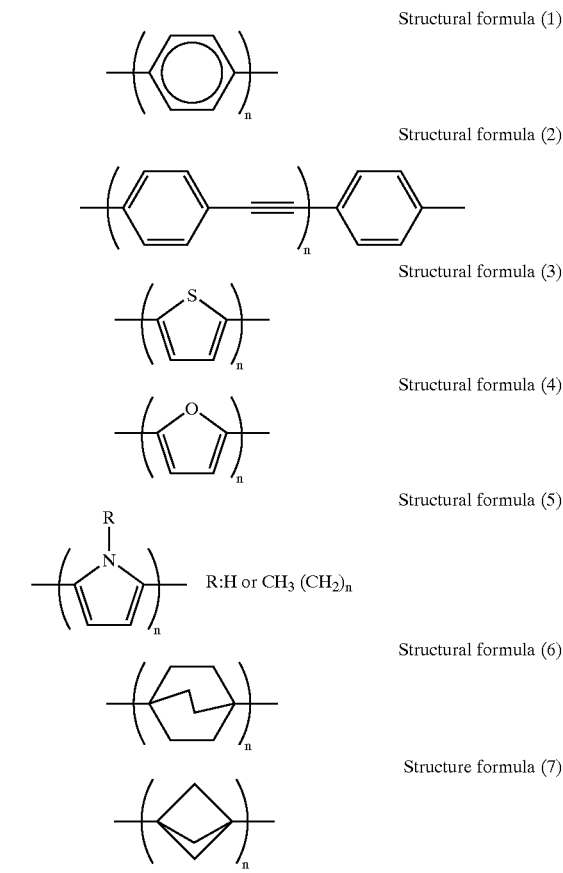

Structural formula (1)

Structural formula (2)

Structural formula (3)

Structural formula (4)

Structural formula (5)

R:H or $CH_3$ $(CH_2)_n$

Structural formula (6)

Structure formula (7)

In this case, when a substrate having a coating layer of gold on the surface thereof is used as the substrate, the resolving power can be improved by the effect of self-organization of the molecules included in the molecular ink.

Figure 2A:
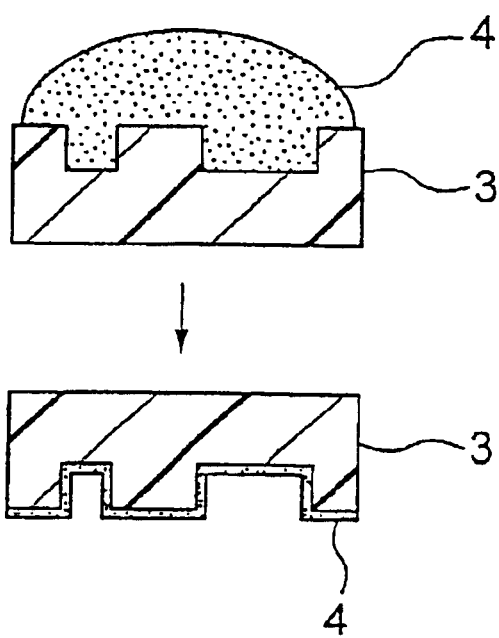
FIGS. 2(*a*) and (*b*) are explanatory drawings of a method of applying molecular ink on a stamp.

Two methods of applying molecular ink 4 on the stamp 3 are shown in FIG. 2. The method shown in FIG. 2(*a*) is a wet inking method in which the whole surface of stamp 3 is applied by filling the whole surface of stamp 3 with molecular ink 4. The method shown in FIG. 2(*b*) is a contact inking method in which molecular ink 4 is applied only on the top surface of the projected pattern by pushing the flat surface of a PDMS resin 8 impregnated with molecular ink 4 against the stamp 3. The contact inking method is more excellent in resolving power than the wet inking method since the diffusion of molecular ink can be reduced in the contact inking method as compared with the wet inking method.

After forming micro-contact printed patterns 6 on substrate 5, the surface of the substrate is dipped in a hydrophilic molecular solution including hydrophilic molecules dispersed in a solvent which have a chain length shorter than that of hydrophobic molecules included in molecular ink 4, by which chemical modification is given to an area of the surface of the substrate uncovered with micro-contact printed patterns 6, as shown in FIG. 1(*f*), so that a hydrophilic area 7 of hydrophilic molecules dispersed in the solvent which have a chain length shorter than that of the hydrophobic molecules is formed on an area of the substrate uncovered with the micro-contact printed pattern.

In the present invention, the hydrophilic molecular ink used is a solution including molecules having the molecular formula represented by X (any of the under-mentioned structural formulas (1) through (7)) —$(CH_2)_n$— (part expressed by any of the under-mentioned structural formulas (1) through (7)) —$(CH_2)_m$—Y in which m and n $\geq 0$ and X positioned at one end of the molecular formula is a hydrophilic group and Y positioned at the other end of the molecular formula is a group being able to be connected with substrate such as —SH, —COOH, —$SO_3H$, —$PO_3H$, —$PO_3H_2$, —COCl, —$SO_3Cl$, $PO_2$ Cl or —$PO_2$ $Cl_2$ dispersed in an organic solvent such as ethanol, toluene or methylene chloride.

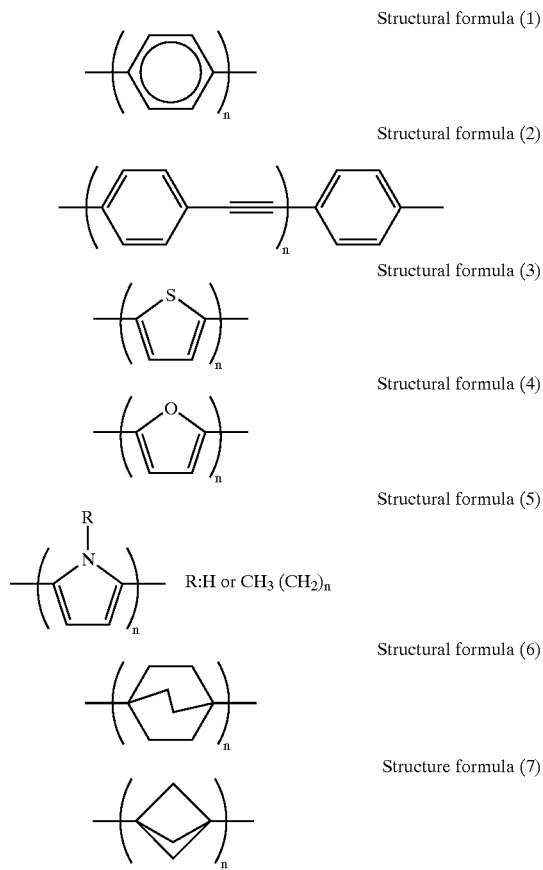

Structural formula (1)

Structural formula (2)

Structural formula (3)

Structural formula (4)

Structural formula (5)

R:H or $CH_3$ $(CH_2)_n$

Structural formula (6)

Structure formula (7)

Further, in the method of the present invention, as the hydrophilic molecular solution used can be hydrophilic molecules selected from among molecules having a phosphoric acid group as the hydrophilic group, molecules having a sulfonic acid group as the hydrophilic group, molecules having an amino group as the hydrophilic group, molecules having a hydroxyl group as the hydrophilic group or molecules having a carboxylic acid group as the hydrophilic group dispersed in an organic solvent such as ethanol, toluene or methylene chloride.

Or, in the present invention, as the hydrophilic molecular solution used can be an ethanol solution of $COOH(CH_2)_y$—SH having a chain length shorter than the chain length of alkanethiol $CH_3(CH_2)_x$—SH.

Accordingly, a hydrophilic area is formed around an area of the micro-contact printed patterns, so that micro-contact printed patterns are formed with a high contrast between the micro-contact printed patterns and an area of the substrate around the micro-contact printed patterns.

In the present invention, if the molecules included in the hydrophobic molecular ink, including hydrophobic molecules dispersed in a solvent, are molecules having an SH group at their terminal end dispersed in the solvent, a substrate with a top coating layer of gold, silver or copper is desirably used as the substrate on which the micro-contact printed patterns are formed. In this case, the resolving power is improved by the effect of self-organization.

In the present invention, if the hydrophobic molecular ink including hydrophobic molecules dispersed in the solvent includes a silane coupler or carboxylic acid, sulfonic acid, phosphonic acid, phosphoric acid or acid chloride, a substrate having a top coating layer of silicon oxide or metal oxide is desirably used as the substrate on which the micro-contact printed patterns are formed. In this case, the resolving power is improved in the same way by the effect of self-organization.

In the present invention, if the hydrophilic molecular ink including hydrophilic molecules dispersed in the solvent includes a silane coupler or carboxylic acid, sulfonic acid, phosphonic acid, phosphoric acid or acid chloride, a substrate having a top coating layer of silicon oxide or metal oxide is desirably used as the substrate on which micro-contact printed patterns are formed. In this case, the resolving power is improved in the same way by the effect of self-organization.

In the present invention, micro-contact printed patterns 6 can be formed of two or more transfer layers formed using a variety of ink containing different molecules.

In the present invention, as the molecular ink or the hydrophilic molecule solution used can be a molecular ink or hydrophilic molecule solution formed of a polymer.

In the present invention, the micro-contact printed patterns can be formed in the order of micro-contact printed patterns of hydrophobic molecules with longer chain lengths.

FIGS. 3(*a*) through (*d*) are explanatory drawings showing the effect shown by a difference between the chain length of hydrophobic molecules and that of hydrophilic molecules. As shown in FIG. 3(*a*), micro-contact printed patterns with gaps 11 are formed on the surface of a substrate using $CH_3(CH_2)_{11}SH$ such that the surface of the substrate with a top coating layer of gold is insufficiently covered with a $CH_3(CH_2)_{11}SH$ molecule layer. Thereafter, the surface of the substrate is dipped in a solution of $COOH(CH_2)_{15}SH$ having an alkyl group with a chain length longer than that of $CH_3(CH_2)_{11}SH$, so that chemical modification is given to the area of the surface of the substrate with the top coating layer of gold around the micro-contact printed patterns, wherein molecules of COOH(CH$_2$)$_{15}$SH come in the gaps 11 of micro-contact printed patterns as shown in FIG. 3(b). In this case, since the molecule of COOH(CH$_2$)$_{15}$SH is longer than the molecule of CH$_3$(CH$_2$)$_{11}$SH, the COOH group of molecules of COOH(CH$_2$)$_{15}$SH projects from between molecules of CH$_3$(CH$_2$)$_{11}$SH. Accordingly, the hydrophilic chemical modification given on an area of the surface of the substrate around the micro-contact printed patterns by COOH(CH$_2$)$_{15}$SH results in the reduction of the contrast between micro-contact printed patterns and the area of the surface of the substrate around the micro-contact printed patterns. On the other hand, when chemical modification is given to the area of the surface of the substrate around the micro-contact printed patterns, dipping the surface of the substrate in a solution of COOH(CH$_2$)$_3$SH having a chain length shorter than that of CH$_3$(CH$_2$)$_{11}$SH as shown in FIG. 3(c), the molecules of COOH(CH$_2$)$_3$SH are covered with the molecules of CH$_3$(CH$_2$)$_{11}$SH as shown in FIG. 3(d). Accordingly, the contrast between the micro-contact printed patterns and the area of the surface of the substrate around the micro-contact printed patterns is not reduced.

Figure 4A:
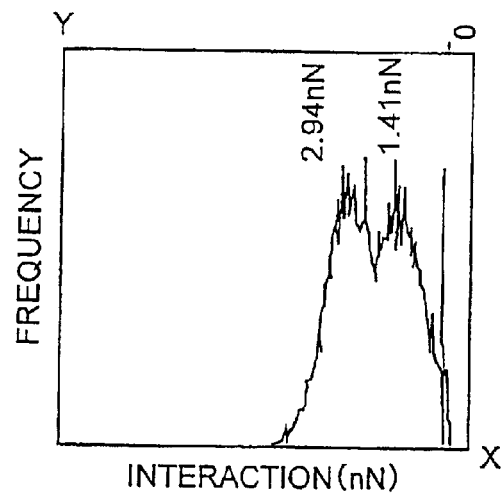
FIGS. 4(*a*) through (*c*) are histograms showing the results of the adhering force between an AFM chip and a sample having micro-contact printed patterns measured in water through a chemical force microscope.
Figure 4B:
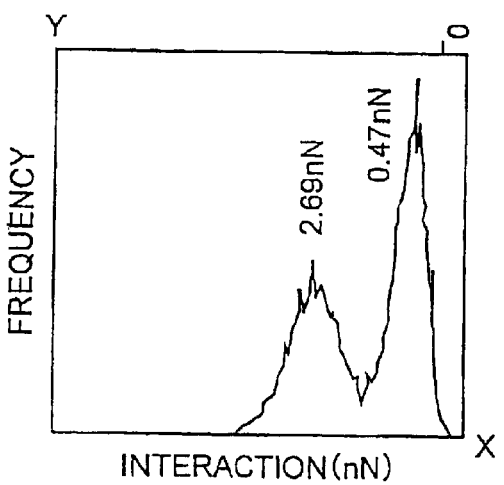
Figure 4C:
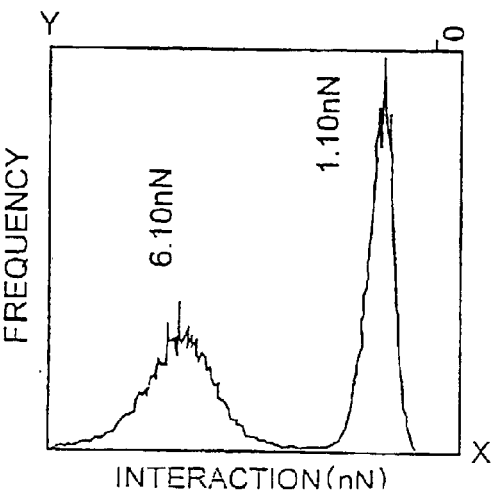

FIGS. 4(a) through (c) are histograms showing the results of the adhering force between an AFM (atomic force microscope) chip with a top coating layer of gold to which chemical modification is given by 1 ml of 1-eicosanethiol and a sample having micro-contact printed patterns measured in water through a chemical force microscope, wherein each coordinate has an orthogonal coordinate system with interaction (nN) as the abscissa and frequency as the coordinate.

FIG. 4(a) shows a histogram of interaction when the micro-contact printed patterns are formed with CH$_3$(CH$_2$)$_{11}$SH and chemical modification is given to the area of the surface of the substrate around the micro-contact printed patterns with COOH(CH$_2$)$_{15}$SH, wherein two peaks approach each other. Accordingly, it is understood that the contrast between the area of the micro-contact printed patterns and the area of the surface of the substrate around the micro-contact printed patterns is low.

FIG. 4(b) shows a histogram of interaction when the micro-contact printed patterns are formed with CH$_3$(CH$_2$)$_{11}$SH and chemical modification is given to the area of the surface of the substrate micro-contact printed patterns with COOH(CH$_2$)$_{10}$SH, wherein the interval between two peaks becomes wider as compared with the case shown in FIG. 4(a). Accordingly, it is understood that the contrast between the area of the micro-contact printed patterns and the area of the surface of the substrate around the micro-contact printed patterns is somewhat found.

FIG. 4(c) shows histogram of interaction when the micro-contact printed patterns are formed with CH$_3$(CH$_2$)$_{11}$SH and chemical modification is given to the area of the surface of the substrate around the micro-contact printed patterns with COOH(CH$_2$)$_3$SH, wherein two peaks are largely distant from each other. Accordingly, it is understood that the contrast between the area of the micro-contact printed patterns and the area of the surface of the substrate around the micro-contact printed patterns is apparently found.

As mentioned hereinbefore, in a patterning method for micro-contact printing comprising the steps of: applying a resin on a master having projected patterns, hardening the resin; removing the hardened resin from the master to make a stamp of the resin; applying a molecular ink including hydrophobic molecules dispersed in a solvent on the stamp; forming micro-contact printed patterns of a hydrophobic molecular layer on a substrate by means of the stamp on which the molecular ink is applied; and dipping the substrate with micro-contact printed patterns in a hydrophilic molecule solution dispersed in a solvent to give chemical modification to the areas of the surface of substrate around the micro-contact printed patterns, a solution including hydrophilic molecules having a chain length shorter than the chain length of hydrophobic molecules included in the molecular ink is used as the hydrophilic molecule solution. However, micro-contact printed patterns may be produced also by a patterning method for micro-contact printing comprising the steps of: applying a resin on a master having projected patterns, hardening the resin; removing the hardened resin from the master to make a stamp of the resin; applying a molecular ink including hydrophilic molecules dispersed in a solvent on the stamp; forming micro-contact printed patterns of a hydrophilic molecular layer on a substrate by means of the stamp on which the molecular ink is applied; and dipping the substrate with micro-contact printed patterns in a hydrophobic molecule solution including hydrophobic molecules dispersed in a solvent to give chemical modification to areas of the surface of the substrate around the micro-contact printed patterns, wherein a solution including hydrophobic molecules having a chain length shorter than the chain length of hydrophilic molecules included in the molecular ink is used as the hydrophobic molecule solution.

In this case, the ink used can be a molecular ink including hydrophilic molecules dispersed in a solvent.

A solution mentioned above can be used as the hydrophobic solution.

Then, referring to FIGS. 6(a) through (e), the process of a patterning method for micro-contact printing of the present invention is explained.

Figure 6A:
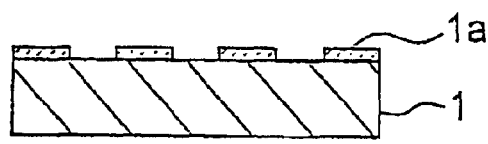
FIGS. 6(*a*) through (*e*) is a schedule drawing showing a first part of the steps of forming micro-contact printed patterns of hydrophobic molecules on a substrate and giving chemical modification to the area of the substrate around the micro-contact printed patterns by hydrophilic molecules according to the present invention.

First, as shown in FIG. 6(a), a master 1 having the produced pattern with a desired height is produced. As materials of the master 1 is used a layer of silicon or quartz or a laminate of a layer of silicon or quartz with a layer of metal or metal oxide. Then, projected patterns are formed with a resist, silicon or quartz metal or oxide or nitride thereof 1a by photolithography or by ionizing radiation lithography such as electron beam lithography or AFM lithography. The height of the projected patterns is desirably about 1 through 5 µm.

Figure 6B:
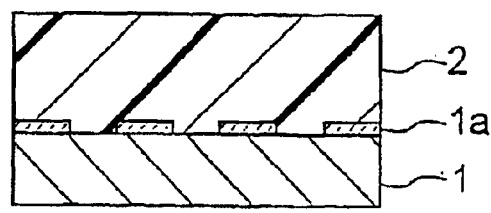
Figure 6C:

Then, as shown in FIG. 6(b), a resin 2 is applied on the surface of the master 1 having the projected patterns and then the resin 2 is removed from the master 1 by which a stamp 3 made of the resin is formed as shown in FIG. 6(c). Polydimethylsiloxane (PDMS) is preferably used as the resin forming the stamp 3. The stamp 3 is formed after the master by a method comprising the steps of spin-coating the PDMS resin on the surface of the master, hardening the PDMS resin and then removing the hardened resin from the master.

Figure 6D:
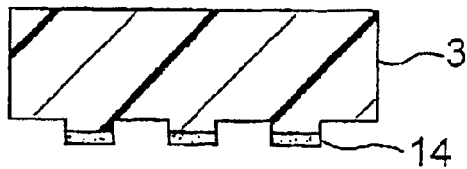
Figure 6E:
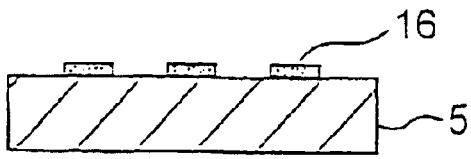

Then, as shown in FIG. 6(d), a molecular ink 14 including hydrophobic molecules dispersed in a solvent is applied on the stamp 3 and micro-contact printed patterns 16 made of hydrophobic molecules are formed on the surface of the substrate 5 with the top coating layer of gold using the stamp 3.

Ink including any molecules having an SH group at a terminal end thereof, silane coupler, or carboxylic acid, sulfonic acid, phosphonic acid, phosphoric acid or acid chloride thereof can be used as the molecular ink 14 including hydrophobic molecules dispersed in a solvent. In this case, when using a substrate with a top coating layer of gold as the substrate, the resolving power is improved by the effect of self-organization of molecules included in the molecular ink.

Further, as the hydrophobic molecular ink used can be an ink including molecules having the molecular formula represented by $X_1$ (any of the under-mentioned structural formulas (1) through (7)) —$(CH_2)_n$— (any of the under-mentioned structural formulas (1) through (7)) —$(CH_2)_m$—Y, in which m and n $\geq 0$ and $X_1$ positioned at one end of the molecular formula is a hydrophobic group and Y positioned at the other end of the molecular formula is a group able to connect with the substrate such as —SH, —COOH, —$SO_3H$, —$PO_3H$, —$PO_3 H_2$, —COCl, —$SO_3Cl$, $PO_2Cl$ or —$PO_2Cl_2$ dispersed in an organic solvent such as ethanol, toluene or methylene chloride.

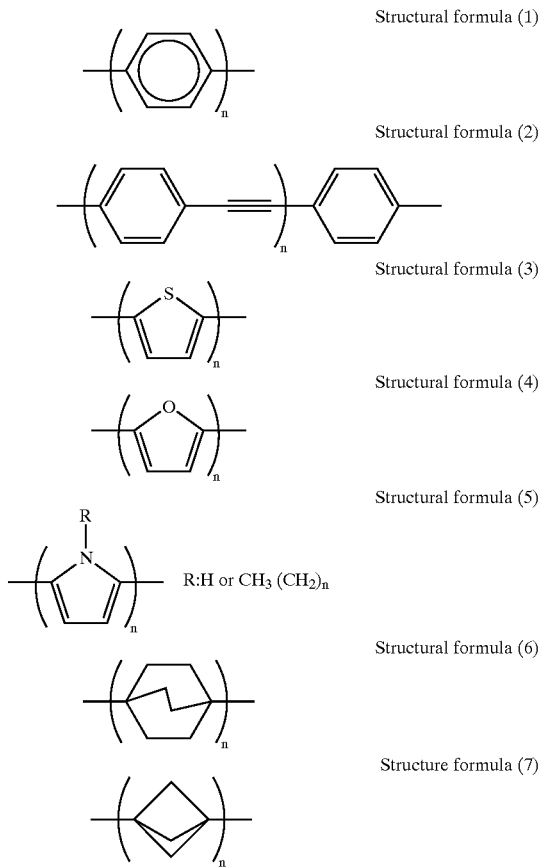

Structural formula (1)

Structural formula (2)

Structural formula (3)

Structural formula (4)

Structural formula (5)

R:H or $CH_3 (CH_2)_n$

Structural formula (6)

Structure formula (7)

Figure 2B:
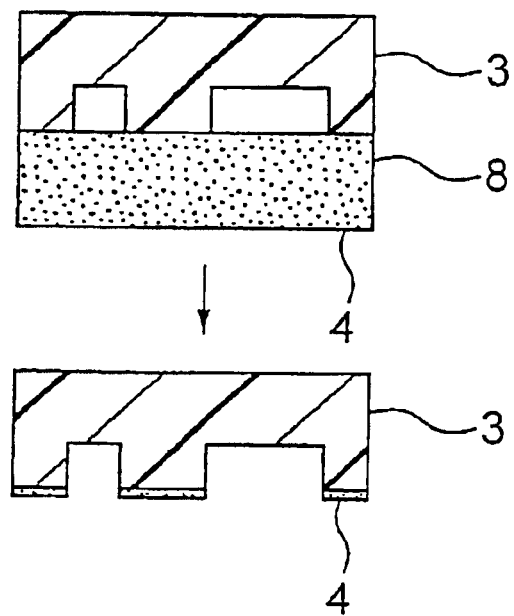
Figure 3A:
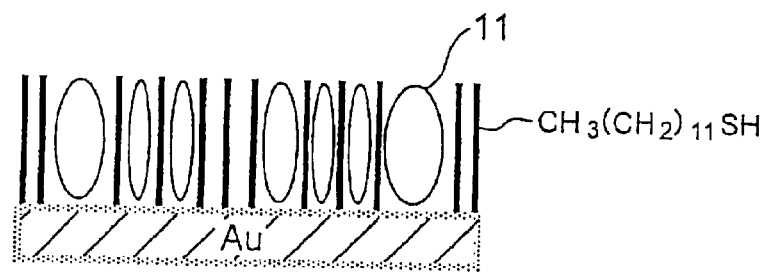
FIGS. 3(*a*) through (*d*) are views for explaining the effect shown by a difference between the chain length of hydrophobic molecules and that of hydrophilic molecules.
Figure 3B:
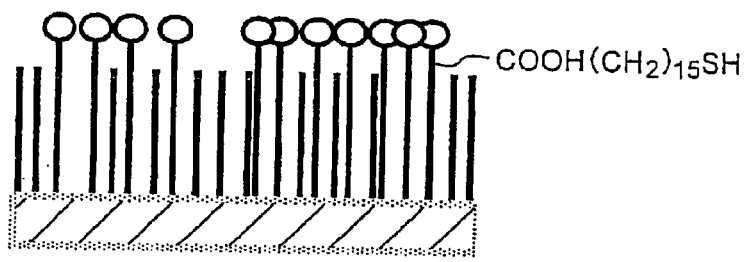
Figure 3C:
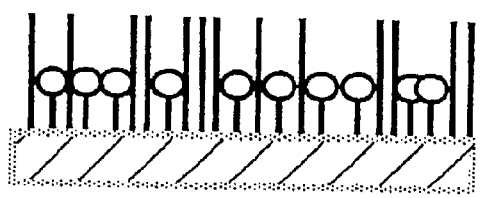
Figure 3D:
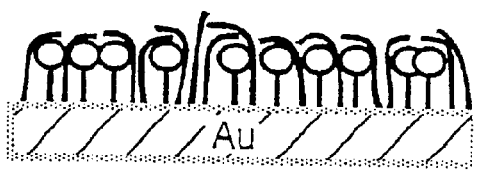
Figure 8A:
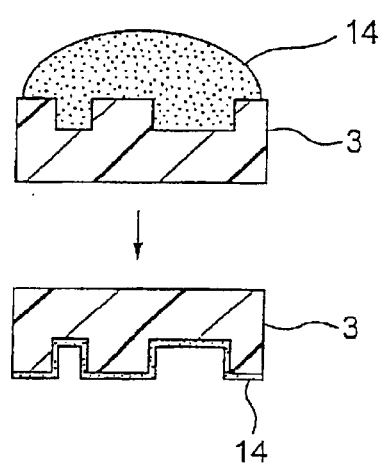
FIGS. 8(*a*) and (*b*) are explanatory drawings of a method of applying molecular ink to a stamp.
Figure 8B:
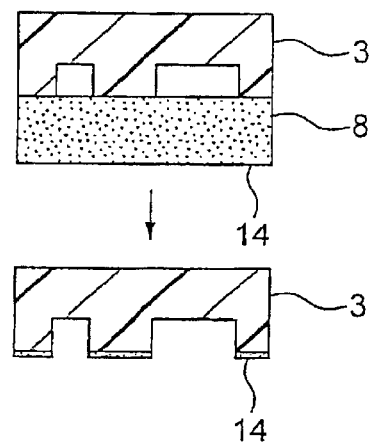

There are two methods of applying molecular ink 14 on the stamp 3 as shown in FIGS. 8(a) and (b). A method shown in FIG. 8(a) is a wet inking method in which the whole surface of the stamp 3 is applied by filling the whole surface of the stamp 3 with a molecular ink 4. A method shown in FIG. 2(b) is a contact inking method in which the molecular ink 4 is applied only on the top surface of projected pattern by pushing the flat surface of the PDMS resin 8 impregnated with molecular ink 4 against the stamp 3. The contact inking method is more excellent in resolving power than the wet inking method since the diffusion of molecular ink can be reduced in the contact inking method as compared with the wet inking method.

Figure 7A:
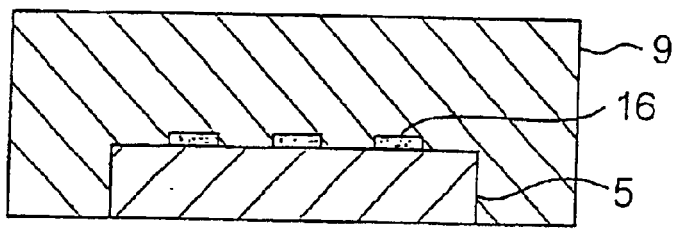
FIG. 7(*a*) through (*b*) is a schedule drawing showing a second part of the steps of forming micro-contact printed patterns on a substrate and giving chemical modification to the area of the substrate around the micro-contact printed patterns following the steps shown in FIGS. 6 (*a*) through (*e*).
Figure 7B:
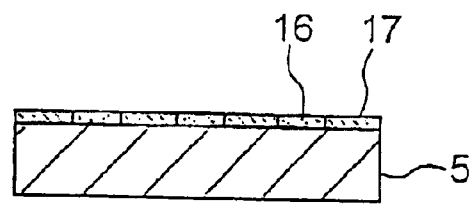

Then, as shown in FIG. 7(a), the substrate 5 with micro-contact printed patterns 16 is dipped in water 9. Hydrophobic molecules forming micro-contact printed patterns 16 are hydrophobicly-bonded with each other to form the assembly of hydrophobic molecules. Accordingly, faultless micro-contact printed patterns are formed.

Then, chemical modification is given to an area of the surface of the substrate 5 uncovered with the micro-contact printed patterns 16 made of molecules hydrophobicly-bonded using a solution of $COOH(CH_2)_y$—SH dispersed in water or solution of $COOH(CH_2)_y$—SH dispersed in KOH aqueous solution. Accordingly, a hydrophilic area 17 is formed around the micro-contact printed patterns without damaging the hydrophobic property of the area of hydrophobic micro-contact printed patterns, so that the micro-contact printed patterns can be formed with a high contrast between the micro-contact printed patterns and the areas of the substrate around the micro-contact printed patterns.

Further, in a patterning method for micro-contact printing of the present invention, a chemical modification is given to the surface of the substrate around the micro-contact printed patterns by a hydrophilic molecular ink in water, and thereafter further chemical modification can be given at a high degree to the area of the surface of the substrate around the micro-contact printed patterns with hydrophobic molecules.

Figure 9A:
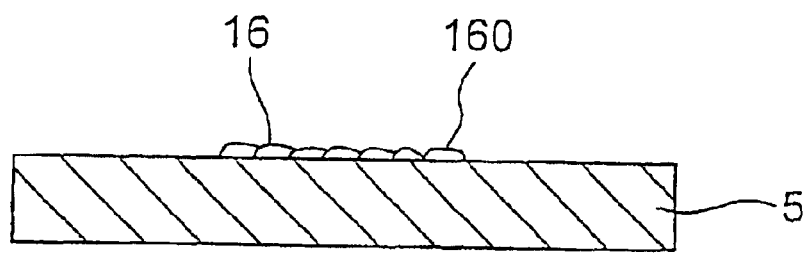
FIGS. 9(*a*) and (*b*) are views for explaining a method of forming micro-contact printed patterns of the present invention utilizing hydrophobic bonding.

FIG. 9 is a view explaining the effect of a patterning method for micro-contact printing of the present invention utilizing hydrophobic-bonding. FIG. 9(a) shows schematically a hydrophobic molecular layer 160 formed by dipping the formed micro-contact printed patterns 16 in the water in the state of assembly of hydrophobic molecules hydrophobicly-bonded with each other. As apparent from this, an area of the micro-contact printed patterns 16 is covered with an assembled hydrophobic molecular layer 160 so that micro-contact printed patterns having few defects are formed. Namely, the film of micro-contact printed patterns 16 is formed without exposing the surface of the substrate under the micro-contact printed patterns.

Figure 9B:
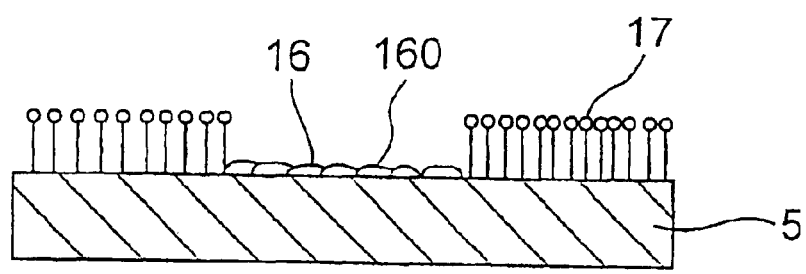

Then, chemical modification is given to the area of the surface of the substrate around the micro-contact printed patterns 16 using a solution of $COOH(CH_2)_y$—SH dispersed in water or a solution of $COOH(CH_2)_y$—SH dispersed in KOH aqueous solution. Accordingly, a hydrophilic area 17 is formed around the micro-contact printed patterns without damaging the hydrophobic property of the area of the hydrophobic micro-contact printed patterns as shown in FIG. 9(b), so that the micro-contact printed patterns 16 can be formed with high contrast between the micro-contact printed patterns 16 of the hydrophobic molecular layer 160 and the areas of the substrate around the micro-contact printed patterns 16.

Further, in the above-mentioned invention, hydrophilic chemical modification is given to an area of the surface of the substrate around the micro-contact printed patterns and then further chemical modification can be given at a high degree to an area of the micro-contact printed patterns using hydrophobic ink in an alcoholic solution or hydrophobic molecules can be transferred on the micro-contact printed patterns using the stamp having hydrophobic ink applied thereon. Parts of defects of the micro-contact printed patterns are mended perfectly in the second process.

Micro-contact printed patterns can be observed using an AFM (atomic force microscope) chip with a top coating layer of gold to which chemical modification is given by 1 ml of 1-eicosanethiol by means of a chemical force microscope.

Then, referring to FIGS. 10(a) through (e), a patterning method for micro-contact printing of the present invention is explained.

Figure 10A:
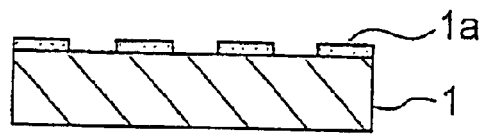
FIGS. 10(*a*) through (*e*) is a schedule drawing showing a first part of the steps of forming micro-contact printed patterns of hydrophobic molecules on a substrate and giving chemical modification to the area of the substrate around the micro-contact printed patterns by hydrophilic molecules according to the present invention.
Figure 10B:
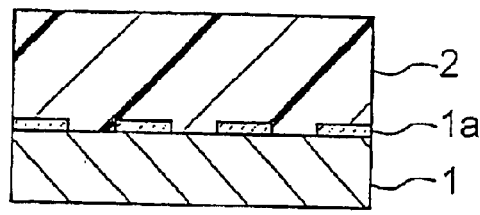
Figure 10C:
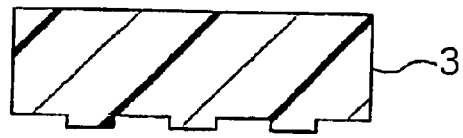
Figure 10D:
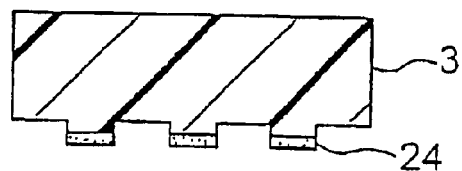
Figure 10E:
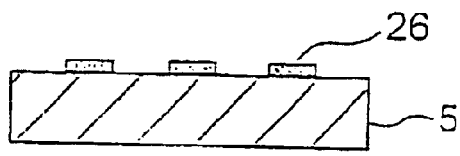

First, as shown in FIG. 10(a), a master 1 having projected patterns of a desired height is formed. As materials of the master 1 is used silicon or quartz or a laminate of a layer of silicon or quartz with a layer of a metal or metal oxide. The projected pattern is formed of a pattern of a resist, silicon or quartz with a layer of a metal or metal oxide or metallic nitride 1*a*. The height of the projected patterns 1 is desirably about 1 through 5 μm.

Then, as shown in FIG. 10(*b*), a resin 2 is applied on the surface of master 1 having projected patterns 1*a*, hardened and then the hardened resin 2 is removed from the master 1 so that the stamp 3 made of resin is formed as shown in FIG. 10(*c*). Polydimethylsiloxane (PDMS) is preferably used as the resin forming the stamp 3. The stamp is formed after the master by a method comprising the steps of spin-coating the PDMS resin on the surface of the master, hardening the PDMS resin and then removing the hardened resin from the master.

Then, as shown in FIG. 10(*d*), a molecular ink 24 including hydrophilic molecules dispersed in a solvent is applied on the stamp 3 and micro-contact printed patterns 26 made of hydrophilic molecules are formed on the surface of the substrate 5 with a top coating layer of gold.

The ink including molecules positioned opposite molecules connected to the substrate and selected from among molecules having phosphoric acid, molecules having a phosphonic acid group, or molecules having an amino group, and molecules having a hydroxyl group dispersed in a solvent can be used as the hydrophilic molecular ink 24. In this case, when using a substrate with the a top coating layer of silicon oxide or metal oxide, the resolving power is improved by the effect of self-organization.

As a method of applying the molecular ink 24 on the stamp 3 is given two methods of a wet inking method and a contact inking method, as mentioned in the description on a patterning method for micro-contact printing of the present invention mentioned above. The contact inking method is more excellent in resolving power than the wet inking method since the diffusion of molecular ink can be reduced in the contact inking method as compared with the wet inking method.

Figure 11A:
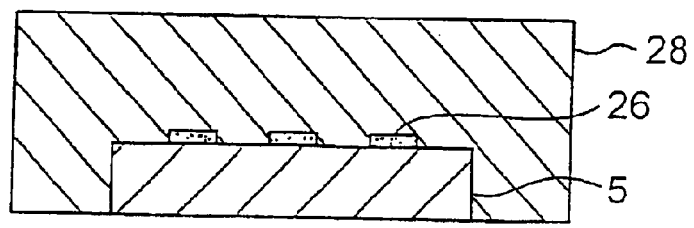
FIGS. 11(*a*) through (*b*) is a schedule drawing showing a second part of the steps of forming micro-contact printed patterns of hydrophobic molecules on a substrate and giving chemical modification to the area of the substrate around the micro-contact printed patterns by hydrophilic molecules following the steps shown in FIGS. 10(*a*) and (*b*).
Figure 11B:
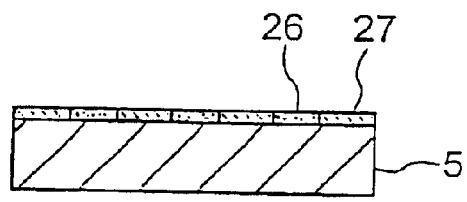

Then, as shown in FIG. 11(*a*), a substrate 5 having micro-contact printed patterns 26 is dipped in an organic solution 28. Since an organic solution 28 is difficult to mix with hydrophilic molecules forming the micro-contact printed patterns 26 and hydrophilic molecules are cohered by hydrogen bonding with each other, the probability that hydrophobic molecules adhere to micro-contact printed patterns in the process of chemical modification being given to the area of the surface of the substrate around the micro-contact printed patterns in a solution including the hydrophobic molecules is low. Accordingly, the area 27 to which chemical modification is given is formed around the micro-contact printed patterns without damaging the hydrophilic property of the area of hydrophilic micro-contact printed patterns, so that micro-contact printed patterns with a high contrast between the micro-contact printed patterns and the area of the surface of the substrate around the micro-contact printed patterns can be formed.

In the above-mentioned invention, after chemical modification is given by an organic solution including the hydrophobic molecular ink, the second chemical modification can be further given to micro-contact printed patterns in an alcoholic solution of hydrophilic molecular ink or hydrophilic molecules can be transferred on the micro-contact printed patterns using a stamp on which the hydrophilic molecular ink is applied. In the second process, parts of defects in the micro-contact printed patterns can be perfectly mended.

Micro-contact printed patterns formed as above-mentioned can be observed using an AFM (atomic force microscope) chip with a top coating layer of gold to which chemical modification is given by 1 ml of 1-eicosanethiol by means of a chemical force microscope.

In the above-mentioned invention, in a patterning method for micro-contact printing comprising the steps of: applying a resin on a master 1 having projected patterns, hardening the resin and thereafter removing the hardened resin from the master 1 to make a stamp 3 of the resin; applying a hydrophilic molecular ink including hydrophilic molecules dispersed in a solvent on the stamp 3; forming micro-contact printed patterns 26 formed of a hydrophilic molecular layer on the substrate by means of the stamp on which the hydrophilic molecular ink is applied; and dipping the substrate with the micro-contact printed patterns in hydrophilic molecular solution including hydrophilic molecules dispersed in the solvent to give chemical modification 27 to areas of the surface of the substrate around the micro-contact printed patterns, wherein after forming the micro-contact printed patterns 26, second chemical modification 27 is given to the areas of the surface of the substrate around the micro-contact printed patterns 26 by the hydrophilic molecular ink in the water.

According to the above-mentioned method of the present invention, printed products can be obtained which are provided with micro-contact printed patterns formed of hydrophobic molecular layers formed on a substrate using a molecular ink including hydrophobic molecules dispersed in a solvent and hydrophilic molecular layers formed on the area of the surface of the substrate around the micro-contact printed patterns, wherein the chain length of the hydrophilic molecules is shorter than the chain length of the hydrophobic molecules.

Further, instead of producing the printed product as mentioned hereinbefore, a printed product can be also obtained by a patterning method for micro-contact printing comprising the steps of: applying a resin on a master having projected patterns, hardening the resin and thereafter removing the hardened resin from the master to make a stamp of the resin; applying a molecular ink including hydrophilic molecules dispersed in a solvent on the stamp; forming micro-contact printed patterns of the hydrophilic molecular layer on a substrate by means of the stamp on which the hydrophilic molecular ink is applied; and dipping the substrate with micro-contact printed patterns in a hydrophilic molecule solution including hydrophilic molecules dispersed in a solvent to give chemical modification to areas of the surface of the substrate around the micro-contact printed patterns, wherein after forming the micro-contact printed patterns, chemical modification is given to the areas of the surface of the substrate around the micro-contact printed patterns by the hydrophobic molecular ink in the organic solution.

In this case, after giving chemical modification to the areas of the surface of the substrate around the micro-contact printed patterns by the hydrophobic molecular ink in the organic solution, chemical modification can be further given to the micro-patterns at a higher density to the micro-contact printed patterns in an alcoholic solution or hydrophilic molecules may be again transferred on the micro-contact printed patterns using a stamp filled with hydrophilic molecules. In the second process, parts of defects in the micro-contact printed patterns can be perfectly mended.

Further, as a hydrophobic molecular ink including hydrophobic molecules dispersed in a solvent can be used a hydrophobic molecular ink mentioned above.

Further, as a hydrophilic molecular ink including hydrophilic molecules dispersed in a solvent can be used a hydrophilic molecular ink including hydrophilic molecules dispersed in a solvent mentioned above.

Then, a patterning method for micro-contact printed printing of the present invention is explained further in detail giving examples.

EXAMPLE 1

First, a thin film of chromium was formed on a surface of a quartz plate by a sputtering method. Resist patterns with a thickness of 4000 Å were formed on the quartz plate with a thin film of chromium to form a master with a height on the surface of the quartz plate with the thin film of chromium. PDMS resin was spin-coated or cast on the surface of the master with resist patterns and was heat-treated at 65° C. for four hours to be hardened. Thereafter, the hardened PDMS resin was removed from the master to form a stamp. Then, a molecular ink including an ethanol solution of $CH_3(CH_2)_{19}SH$ was applied on the stamp by the contact inking method.

On the other hand, a substrate with an evaporation layer of gold on a glass plate was provided. The stamp having the molecular ink on the surface thereof was pressed against the surface of the substrate by which the molecular ink was transferred to the substrate. Thereby, micro-contact printed patterns were formed.

Then, chemical modification was given to the area of the surface of the substrate around the micro-contact printed patterns using an ethanol solution of $COOH(CH_2)_{10}SH$ so that a printed product is formed.

Figure 5:
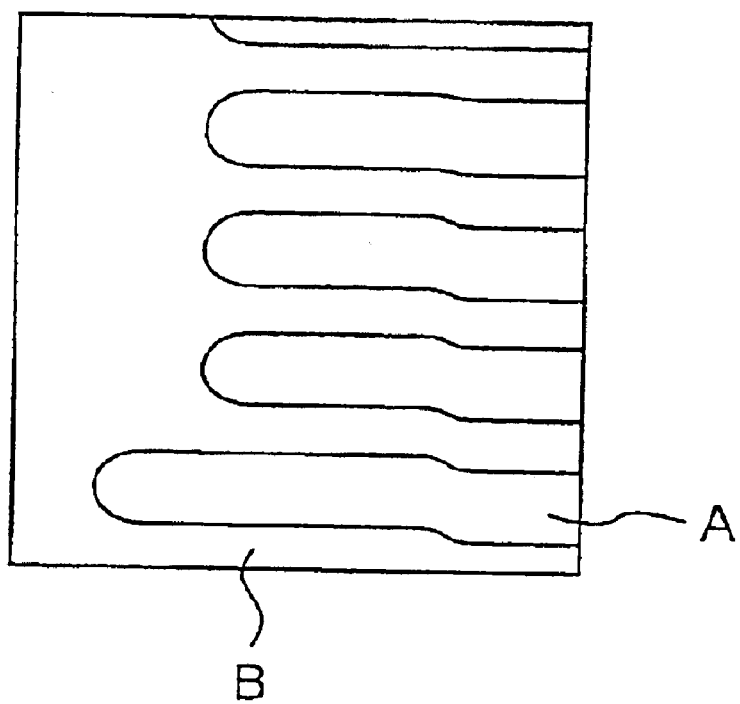
FIG. 5 shows an image obtained by the observation of micro-contact printed patterns formed in a first example through a chemical force microscope.

FIG. 5 shows an image of the printed product observed through the chemical force microscope. In FIG. 5, A indicates the hydrophobic area and B indicates the hydrophilic area.

(Comparative Example)

The same process as in Example 1 was carried out for the formation of micro-contact printed patterns except a molecular ink of an ethanol solution of $CH_3(CH_2)_{10}SH$ was used instead of the molecular ink of an ethanol solution of $CH_3(CH_2)_{19}SH$ for the formation of micro-contact printed patterns and $COOH(CH_2)_{20}SH$ was used instead of an ethanol solution of $COOH(CH_2)_{10}SH$ for the chemical modification given to the area of the surface of the substrate around the micro-contact patterns. However, resolution of the micro-contact patterns was impossible since the contrast between the micro-contact printed patterns and the area of the surface of the substrate around the micro-contact printed patterns was low.

EXAMPLE 2

First, a thin film of chromium was formed on a surface of a quartz plate by the sputtering method. Resist patterns with a thickness of 4000 Å were formed on the quartz plate with a thin film of chromium to form a master with a height on the surface of the quartz plate with the thin film of chromium. PDMS resin was spin-coated on the surface of the master with the resist patterns and was heat-treated at 65° C. for four hours to be hardened. Thereafter, the hardened PDMS resin was removed from the master to form a stamp. Then, a molecular ink including an ethanol solution of $CH_3(CH_2)_{19}SH$ was applied on the stamp by the contact inking method.

On the other hand, a substrate with an evaporation layer of gold on a glass plate was provided. The stamp having the molecular ink on the surface thereof was pressed against the surface of the substrate so that the molecular ink was transferred to the substrate. Thereby, micro-contact printed patterns were formed.

Then, the substrate with the micro-contact printed patterns was dipped in water so that $CH_3(CH_2)_{19}SH$ was hydrophobicly-bonded to be cohered. Then, chemical modification was given to the area of the surface of the substrate around the micro-contact printed patterns using an aqueous solution of $COOH(CH_2)_{10}SH$ under the above-mentioned state. Thereby, a printed product with a high contrast between the micro-contact printed patterns and the area of the surface of the substrate around the micro-contact printed patterns was formed.

EXAMPLE 3

After forming the printed product according to the Example, chemical modification by hydrophobic molecules was again given to the micro-contact printed patterns using a stamp filled with hydrophobic ink. In the second process, parts of defects in the micro-contact printed patterns can be perfectly mended. Thereby, a printed product with a further higher contrast between the micro-contact printed patterns and the area of the surface of the substrate around the micro-contact printed patterns was formed.

EXAMPLE 4

According to Example 2, after chemical modification of the area of the surface of the substrate around the micro-contact printed patterns by hydrophilic molecules, further chemical modification was given to the micro-contact printed patterns at a higher density by hydrophobic molecules included in an alcoholic solution of hydrophobic molecules. In this process, parts of defects of the micro-contact printed patterns were perfectly mended so that a printed product having a further higher contrast between the micro-contact printed patterns and the area of the surface of the substrate around the micro-contact printed patterns could be obtained.

EXAMPLE 5

The same process as in Example 4 was carried out except a substrate having a coating of silicon oxide thereon was used as the substrate and an ethanol solution of $OH(CH_2)_{10}COOH$ was used as the molecular ink, in which micro-contact printed patterns of hydrophilic molecules was formed on the substrate.

Then, the substrate having the micro-contact printed patterns was dipped in a benzene solution of $CH_3(CH_2)_{10}COOH$ and in this state, chemical modification by $CH_3(CH_2)_{10}COOH$ was given to the surface of the substrate around the micro-contact printed patterns so that a printed product having a high contrast between the micro-contact printed patterns and the area of the surface of the substrate around the micro-contact printed patterns was formed.

EXAMPLE 6

After forming the printed product according to Example 3, chemical modification of the hydrophilic molecules was again given to the micro-contact printed patterns using a stamp filled with a hydrophilic ink. In this process, parts of defects of the micro-contact printed patterns were perfectly mended so that a printed product having a further higher contrast between the micro-contact printed patterns and the area of the surface of the substrate around the micro-contact printed patterns could be obtained.

EXAMPLE 7

After chemical modification by hydrophilic molecules was given to the area of the surface of the substrate around the micro-contact printed patterns in the water according to Example 5, further chemical modification was given to the micro-contact printed patterns at a higher density in an alcoholic solution. In this process, parts of defects of the micro-contact printed patterns were perfectly mended so that a printed product having a further higher contrast between the micro-contact printed patterns and the area of the surface of the substrate around the micro-contact printed patterns could be obtained.

As mentioned hereinbefore according to the invention, in a patterning method for micro-contact printing comprising the steps of: applying a resin on a master having projected patterns, hardening the resin and thereafter removing the hardened resin from the master to make a stamp of the resin; applying a molecular ink including hydrophobic molecules dispersed in a solvent on the stamp; forming micro-contact printed patterns formed of a hydrophobic molecular layer on a substrate by means of the stamp on which the molecular ink is applied; dipping the substrate with micro-contact printed patterns in a hydrophilic molecule solution dispersed in a solvent to give chemical modification to the areas of the surface of the substrate around the micro-contact printed patterns, the solution including the hydrophilic molecules having a chain length shorter than the chain length of the hydrophobic molecules included in the molecular ink is used as the hydrophilic molecule solution. According to this, a printed product having a contrast between the micro-contact printed patterns and the area of the surface of the substrate around the micro-contact printed patterns can be briefly formed.

Further, as mentioned above, in a patterning method for micro-contact printing comprising the steps of: applying resin on a master having projected patterns, hardening the resin and thereafter removing the hardened resin from the master to make a stamp of the resin; applying a molecular ink including hydrophilic molecules dispersed in a solvent on the stamp; forming micro-contact printed patterns of the hydrophilic molecular layer on a substrate by means of the stamp on which the molecular ink is applied; and dipping the substrate with micro-contact printed patterns in a hydrophobic molecule solution including hydrophobic molecules dispersed in a solvent to give chemical modification to areas of the surface of the substrate around the micro-contact printed patterns, the solution including hydrophobic molecules having a chain length shorter than the chain length of the hydrophilic molecules included in the molecular ink is used as the hydrophobic molecule solution. According to this patterning method, a printed product having micro-contact printed patterns with a high contrast between the micro-contact printed patterns and the area of the surface of the substrate around the micro-contact printed patterns can be also similar formed. Further, since it is unnecessary to increase the density of the ink to get rid of defects from the micro-contact printed patterns in forming the micro-contact printed patterns, the reduction of the resolving power produced by running and spreading of the ink can be avoided.

Further, according to a patterning method for micro-contact printing of the present invention, since after forming the micro-contact printed patterns of the hydrophobic molecular layer formed on a substrate using a molecular ink including hydrophobic molecules dispersed in a solvent, chemical modification is given to the areas of the surface of the substrate around the micro-contact printed patterns by the hydrophilic molecular ink in the water under the state that the hydrophobic molecules are hydrophobicly-bonded with each other, the probability of hydrophilic molecules coming in the hydrophobic molecular layer is low. As a result, the contrast between the micro-contact printed patterns chemically-modified by the hydrophilic molecules and the area of the surface of the substrate around the micro-contact printed patterns can be obtained without damaging the hydrophobic property of the micro-contact patterns.

Further, according to a patterning method for micro-contact printing mentioned above, after forming the micro-contact printed patterns of a hydrophilic molecular layer formed on a substrate using a molecular ink including hydrophilic molecules, chemical modification is given to the areas of the surface of the substrate around the micro-contact printed patterns by a hydrophobic molecular ink in an organic solution. Accordingly, the probability of hydrophobic molecules coming in the hydrophilic molecular layer is low. As a result, the contrast between the micro-contact printed patterns chemically-modified by the hydrophilic molecules and the area of the surface of the substrate around the micro-contact printed patterns can be obtained without damaging the hydrophilic property of the micro-contact patterns.

Printed products of the present invention can be utilized for the connection of specified molecules, immobilization of enzymes, cells or DNA and others, utilizing the combination of different properties of surfaces in the printed products.

What is claimed is:

1. Printed product provided with micro-contact printed patterns of hydrophobic molecules layer formed on a substrate using molecular ink including hydrophobic molecules dispersed in solvent and with hydrophilic molecule layer formed on areas of the surface of substrate around the micro-contact printed patterns, wherein the chain length of hydrophilic molecule is shorter than the chain length of hydrophobic molecules.

2. Printed product as claimed in claim 1, wherein the molecular ink or the hydrophilic solution is formed of polymer.

3. Printed product as claimed in claim 1, wherein parts of micro-contact printed patterns are printed in order of chain length of micro-contact printed patterns formed of hydrophobic molecules with longer chain length.

4. Printed product with micro-contact printed patterns formed of hydrophilic molecule layer formed on a substrate using molecular ink including hydrophilic molecules dispersed in solvent and with hydrophobic molecules layer formed on areas of the surface of substrate around the micro-contact printed patterns, wherein the chain length of hydrophobic molecules is shorter than the chain length of hydrophilic molecules.

5. Printed product as claimed in claim 4, wherein molecules included in the molecular ink or hydrophobic molecule solution is of polymer.

6. Printed product as claimed in claim 4, wherein parts of micro-contact printed patterns are printed in order of micro-contact printed patterns including molecules with longer chain length.

7. Printed product provided with micro-contact printed patterns of hydrophobic molecular layer formed on a substrate using hydrophobic molecular ink including hydrophobic molecules and hydrophilic molecular layer formed on areas of the surface of substrate around the micro-contact printed patterns, wherein the printed product is produced utilizing properties of hydrophobic molecules of the micro-contact printed patterns being cohesive by cohesive connection in water.

8. Printed product provided with micro-contact printed patterns of hydrophilic molecular layer formed on a substrate using hydrophilic molecular ink including hydrophilic molecules and hydrophilic molecular layer formed on areas of the surface of substrate around the micro-contact printed patterns, wherein the printed product is produced utilizing properties of hydrophilic molecules of the micro-contact printed patterns being cohesive by hydrogen connection in an organic solution.

* * * * *